US010462905B2

(12) United States Patent
Gottwald et al.

(10) Patent No.: US 10,462,905 B2
(45) Date of Patent: Oct. 29, 2019

(54) PRINTED CIRCUIT BOARD ELEMENT WITH INTEGRATED ELECTRONIC SWITCHING ELEMENT, POWER CONVERTER AND METHOD FOR PRODUCING A PRINTED CIRCUIT BOARD ELEMENT

(71) Applicant: Schweizer Electronic AG, Schramberg (DE)

(72) Inventors: Thomas Gottwald, Dunningen (DE); Christian Rössle, St. Georgen (DE)

(73) Assignee: SCHWEIZER ELECTRONIC AG, Schramberg (DE)

( * ) Notice: Subject to any disclaimer, the term of this patent is extended or adjusted under 35 U.S.C. 154(b) by 0 days.

(21) Appl. No.: 16/280,762

(22) Filed: Feb. 20, 2019

(65) Prior Publication Data

US 2019/0274219 A1 Sep. 5, 2019

(30) Foreign Application Priority Data

Mar. 5, 2018 (DE) .......................... 10 2018 104 972

(51) Int. Cl.
*H05K 1/02* (2006.01)
*H05K 3/00* (2006.01)
*H05K 1/18* (2006.01)
*H05K 1/11* (2006.01)
(Continued)

(52) U.S. Cl.
CPC ............. *H05K 1/183* (2013.01); *H05K 1/115* (2013.01); *H05K 3/32* (2013.01); *H05K 3/4697* (2013.01); *H05K 2201/10015* (2013.01); *H05K 2201/10053* (2013.01)

(58) Field of Classification Search
CPC ... H05K 1/0269; H05K 3/0008; H05K 1/0266
See application file for complete search history.

(56) References Cited

U.S. PATENT DOCUMENTS

| | | | |
|---|---|---|---|
| 2013/0011972 | A1 | 1/2013 | Standing |
| 2013/0069211 | A1 | 3/2013 | Meyer-Berg et al. |
| 2015/0077941 | A1 | 3/2015 | Hosseini et al. |

(Continued)

FOREIGN PATENT DOCUMENTS

| | | |
|---|---|---|
| DE | 69837134 T2 | 6/2007 |
| DE | 102008040906 A1 | 2/2010 |

(Continued)

OTHER PUBLICATIONS

German Patent Office, Search Report, Priority Application DE 10 2018 104 972.2, dated Feb. 14, 2019.

*Primary Examiner* — Jeremy C Norris
(74) *Attorney, Agent, or Firm* — Shlesinger, Arkwright & Garvey LLP

(57) ABSTRACT

A printed circuit board element (LP) having at least one electronic switching element (12.1, 12.2, 12.3) integrated in the printed circuit board element (LP), which switching element comprises two semiconductor switches (14, 16) introduced into a layer sequence of the printed circuit board element (LP) and at least two busbars (20, 22, 24) formed to contact the semiconductor switches (14, 16), wherein the busbars (20, 22, 24) run substantially above one another in the layer sequence of the printed circuit board element (LP) and at least one intermediate circuit capacitor (C; C1, C2, C3, C4) arranged between the two busbars (20, 22) is introduced into the layer sequence of the printed circuit board element (LP).

15 Claims, 8 Drawing Sheets

(51) Int. Cl.
   *H05K 3/46* (2006.01)
   *H05K 3/32* (2006.01)

(56) References Cited

U.S. PATENT DOCUMENTS

2015/0155271 A1   6/2015   Otremba et al.
2018/0233469 A1   8/2018   Palm et al.

FOREIGN PATENT DOCUMENTS

| DE | 102009044641 A1 | 9/2010 |
| DE | 102010036915 A1 | 2/2011 |
| DE | 102012111788 A1 | 6/2013 |
| DE | 102013102542 A1 | 9/2014 |
| DE | 102014113238 A1 | 3/2015 |
| DE | 102014115750 A1 | 4/2015 |
| WO | WO2010/012594 A1 | 2/2010 |
| WO | WO2014/139674 A1 | 9/2014 |

PRINTED CIRCUIT BOARD ELEMENT WITH INTEGRATED ELECTRONIC SWITCHING ELEMENT, POWER CONVERTER AND METHOD FOR PRODUCING A PRINTED CIRCUIT BOARD ELEMENT

TECHNICAL FIELD

The present invention relates to the field of switches and, in particular, rapid switches having an active semiconductor switching element as an electronic switching element integrated into a printed circuit board element. The invention further relates to a power converter and to a method for producing the printed circuit board element.

DESCRIPTION OF THE PRIOR ART

Power converters for operating an electric machine of a hybrid or electric vehicle for converting the available direct current to phase currents for operation of the electric machine are known. Furthermore, it is known to construct power converters from power modules having at least two semiconductor circuit breakers (cf. for example DE 100 37 379 B4 and DE 10 2007 046 969 B3). A layered construction of a power module for a power converter is known from DE 10 2013 207 507 B3. In such power converters formed in printed circuit boards, typically ceramic capacitors, such as, for example, multilayer ceramic capacitors (MLCC), are used as intermediate circuit capacitors.

SUMMARY OF THE INVENTION

Proceeding from this, according to the invention, a printed circuit board element a power converter and a method for producing a printed circuit board element having the features as disclosed herein are proposed.

The basic concept of the invention consists in introducing inserted intermediate circuit capacitors into the layer sequence of the printed circuit board element, for example, in a substantially vertical manner or in a substantially horizontal manner when forming an integrated electronic switching element in a printed circuit board element such as, for example, a half-bridge. Such intermediate circuit capacitors are—as already mentioned at the beginning—typically ceramic capacitors having a ceramic capacitor body and connection areas arranged opposite on the ceramic capacitor body. Usually, these capacitors are mounted horizontally on a surface of the printed circuit board as population components and soldered.

According to the invention, the capacitors are now integrated into the printed circuit board element. This can be done, for example, in a vertically "standing" manner. In connection with the orientation of the capacitors, vertical means in the present case that a capacitor axis extending from one connection area to the opposite connection area lies substantially vertical to an areal extent of the printed circuit board element. In a horizontal arrangement, the described capacitor axis would in turn run substantially parallel to the areal extent of the printed circuit board element.

In the context of the present invention, a printed circuit board element is to be understood in principle as meaning any kind of printed-circuit-board-like layer construction able to be used either independently as a printed circuit board, as a module for interconnection, for example, on a cooling element or as an intermediate product (semi-finished product) provided for embedding in a larger printed circuit board.

The invention therefore provides a printed circuit board element having at least one electronic switching element integrated in the printed circuit board element. The integrated electronic switching element comprises two semiconductor switches introduced into a layer sequence of the printed circuit board element. To contact-connect the semiconductor switches, two busbars are provided, which run in a manner substantially one above the other in the layer sequence of the printed circuit board element. Intermediate circuit capacitors inserted into the layer sequence of the printed circuit board element are provided between the two busbars. The intermediate circuit capacitors can be introduced as described in a substantially vertical manner or else in a substantially horizontal manner.

On account of the arrangement of the busbars in a manner lying substantially one above the other, the invention makes it possible to reduce the inductances and, owing to the vertical or else horizontal introduction of the capacitors and the positive/negative connection areas lying one above the other as a result thereof, to substantially minimize the voltage peaks caused by parasitic inductances. In addition, a reduction of the space requirement per component/capacitor at the same time as an increase in the contact-connection area is associated with the invention. A low-inductance (compared to conventional arrangements) configuration of an electronic switching element is therefore achieved. The associated space-saving design favors integration of the switching elements into printed circuit boards to form sound funnels used, in particular, in the field of motor vehicles, for electric motors.

According to the invention, the at least one intermediate circuit capacitor can be arranged in the core layer of the printed circuit board element and points by way of a first connection area in the direction of the busbar above the core layer and by way of a second connection area in the direction of the busbar below the core layer (vertical or standing arrangement). As an alternative, the at least one intermediate circuit capacitor can be arranged in the core layer of the printed circuit board element and points by way of a first connection area and by way of a second connection area in the direction of the busbar above or below the core layer (horizontal or parallel arrangement).

Further advantages and configurations of the invention result from the description and the appended drawing.

It is self-evident that the features mentioned above and the features yet to be discussed below may be used not only in the respectively specified combination but also in other combinations or individually without departing from the scope of the present invention.

The invention is illustrated schematically in the drawing based on exemplary embodiments and is described in detail below with reference to the drawing.

DETAILED DESCRIPTION

Identical or similar elements in the figures are provided with the same reference signs.

Figure 1:
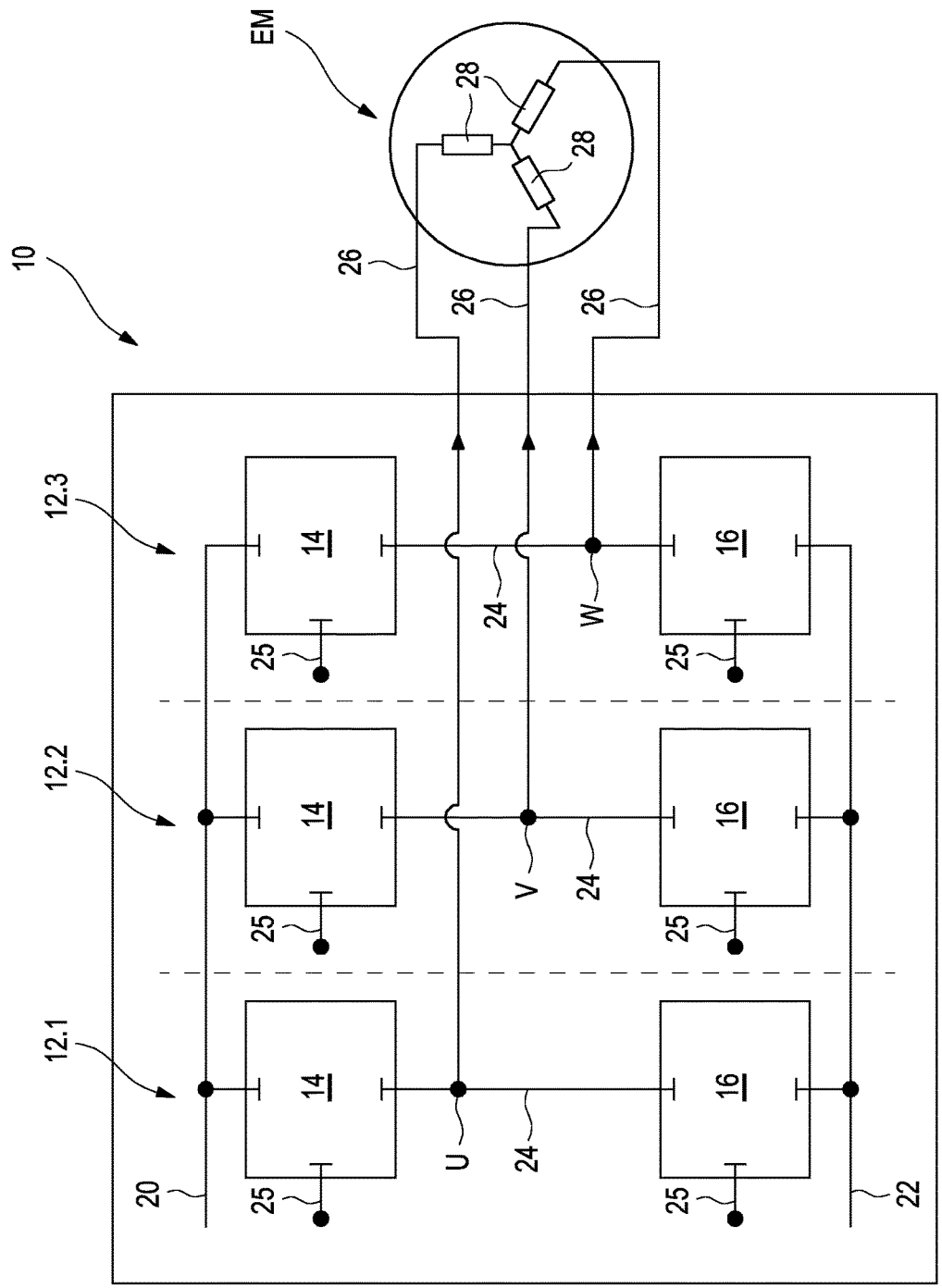
FIG. 1 shows a schematic circuit diagram of a modular power converter connected to an electric motor.

FIG. 1 shows a highly schematic basic sketch of a circuit diagram of a modular power converter 10 constructed according to the invention and connected to an electric motor EM.

The electric motor EM serves, for example, for propulsion of a motor vehicle, and the power converter 10 serves for providing electrical energy in the form of phase currents for the electric motor EM, which in the illustrated exemplary embodiment has three windings 28. The three windings 28 of the electric motor EM are each electrically connected to the power converter 10 by means of a phase current line 26.

In the illustrated exemplary embodiment, the power converter 10 of modular design is formed as a B6 bridge circuit and comprises three substantially identically formed half-bridges 12 (12.1, 12.2, 12.3), arranged in a parallel circuit with respect to one another, between a first power supply line or busbar 20 and a second power supply line or busbar 22. In the illustration of FIG. 1, the half-bridges are separated from one another by the vertical dashed lines. Each of the illustrated half-bridges is an electronic switching element constructed according to the invention, as is explained in even more detail below.

Each of the three half-bridges 12 comprises a respective first semiconductor switch 14 (in this case: high-side) and a second semiconductor switch 16 (in this case: low-side), which are illustrated in the basic sketch of FIG. 1 as rectangles. The two semiconductor switches 14 and 16 of each module 12 are connected to one another by way of a third busbar 24, to which a respective tap (central terminal) U, V and W, respectively, is connected for the phase current lines 26 transmitting the phase current to the electric motor.

In the illustrated exemplary embodiment, the first semiconductor switches 14 are arranged on a positive-voltage-side current path and therefore between the first (positive) busbar 20 and one of the phase current lines 26, and the second semiconductor switches 16 are arranged on a negative-voltage-side current path and therefore between one of the phase current lines 26 and the second (negative) busbar 22.

Each of the semiconductor switches 14, 16 has a power terminal 25 for applying a control signal for a gate terminal of the semiconductor switch 14, 16.

The power converter 10 may have further circuit components, such as, for example, one or more intermediate circuit capacitors, which are not shown in the illustration of FIG. 1 for reasons of better clarity.

Figure 2:
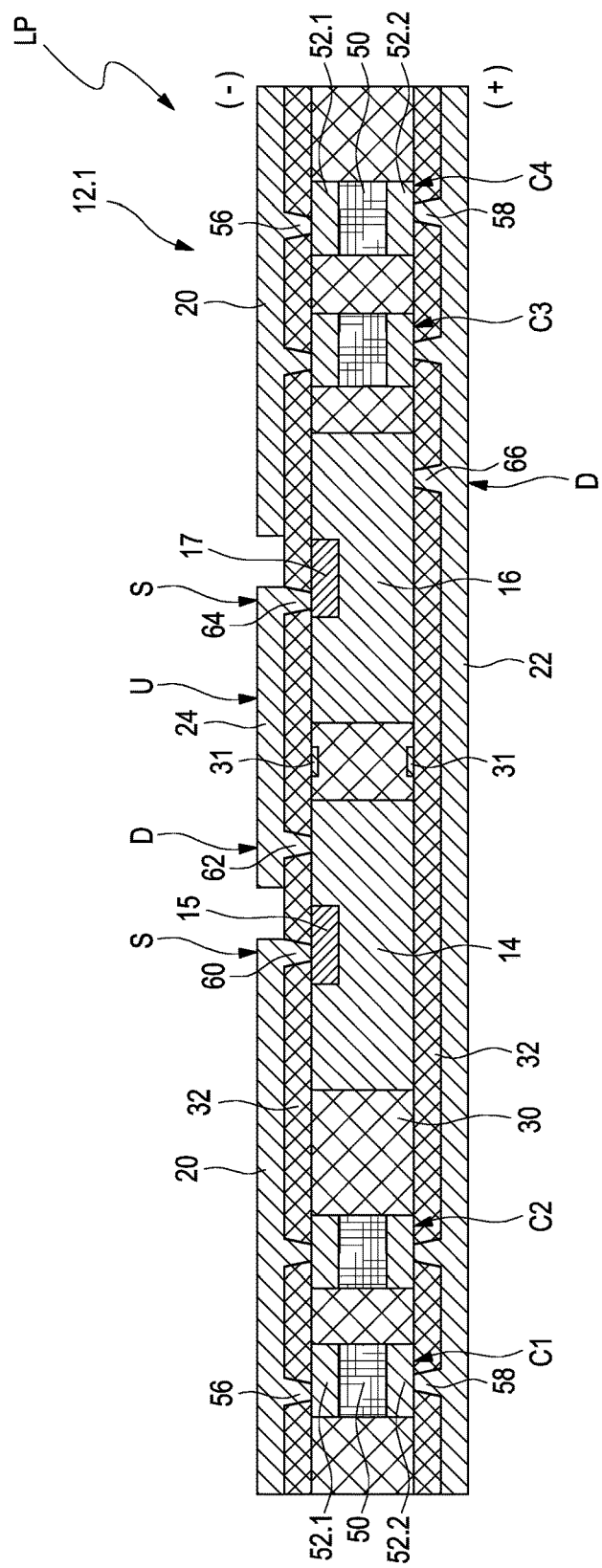
FIG. 2 shows a schematic sectional illustration of a further embodiment of an electronic switching element according to the invention.

FIG. 2 shows a lateral sectional illustration of a printed circuit board element LP according to the invention having an electronic switching element 12.1. The printed circuit board element LP is formed from a layer sequence, namely a core layer or carrier layer 30, which may be formed as an insulating layer (such as, for example, an FR4 layer), to which layers 31 that are conductive on both sides can adjoin, followed by an insulating layer 32 (in the illustrated exemplary embodiment, of the conductive layers 31 only conductor tracks formed therefrom are illustrated by way of example). The conductive layers are hollow in order to prevent short circuits in the region of conductive elements, thus particularly around the inlays 14, 16 and possibly the capacitor contacts. The electronic switching elements may be housed or "bare" switch elements or switch elements mounted on lead frames.

Conductor tracks for forming a first busbar 20 (lying at the top in the illustration of FIG. 2) and a second busbar 22 (lying at the bottom in the illustration of FIG. 2) are provided in turn on the two insulating layers 32. In addition to a non-conductive core layer 30, the use of a copper-clad structured inner layer or a completely non-conductive inner layer are possible as an alternative (in this case, an exposure of copper in the region of the capacitor contacts may be necessary, as will become clear in the following text).

In the described layer construction, a first semiconductor switch 14 having a first chip 15 and a second semiconductor switch 16 having a second chip 17 are arranged in (switch) recesses of the carrier layer 30 that are provided therefor. In the illustrated exemplary embodiment, the orientation of the two semiconductor switches is the same so that the two chips 15, 17 both point in the same direction (upward in the illustrated exemplary embodiment). The first semiconductor switch 14 is connected to the first busbar 20 (source terminal S) by means of blind holes 60 and to a third busbar 24 by way of blind holes 62 (drain terminal D). The phase tap (central terminal) U is formed at the third busbar 24. The second semiconductor switch 16 is accordingly connected to the third busbar 24 lying above it by means of blind holes 64 (source terminal S) and to the second busbar 22 lying below it by means of blind holes 66 (drain terminal D). For reasons of simpler illustration, only one blind hole 60, 62, 64, 66 is illustrated representatively in FIG. 2 in each case.

The busbars 20, 22, 24 can be formed, for example, as thick copper tracks. In the illustrated exemplary embodiment, the bottom busbar 22 constitutes the positive pole link, whereas the top busbar 20 constitutes the negative pole link.

A third busbar 24, already mentioned, serves to connect the first and second semiconductor switch 14, 16 and, in the illustrated exemplary embodiment, is formed in a top plane of the printed circuit board element LP, expediently in the same plane as the top busbar 20 and likewise as a thick copper track (but insulated from 20). In the third busbar 24, a terminal point (central terminal) U for tapping the phase current for the electric motor EM is provided, said terminal point being able to be formed in a manner known per se as a press-in contact, for example.

According to the invention, at least one primary intermediate circuit capacitor C (so-called DC link) is connected between the top/first busbar 20 and the bottom/second busbar 22 (in the illustrated exemplary embodiment, there are four intermediate circuit capacitors C1, C2, C3, C4). The intermediate circuit capacitor may be, for example, a ceramic capacitor (such as a CCC or MLCC capacitor). The fact that one or more of the used intermediate circuit capacitors can also be formed as an RC element (for example as a so-called "snubber" for damping undesired oscillations) and/or possibly additional secondary capacitors of a higher capacitance, such as, for example, electrolytic capacitors, can be used, but which do not have to be embedded, is readily apparent to a person skilled in the art.

Figure 5:
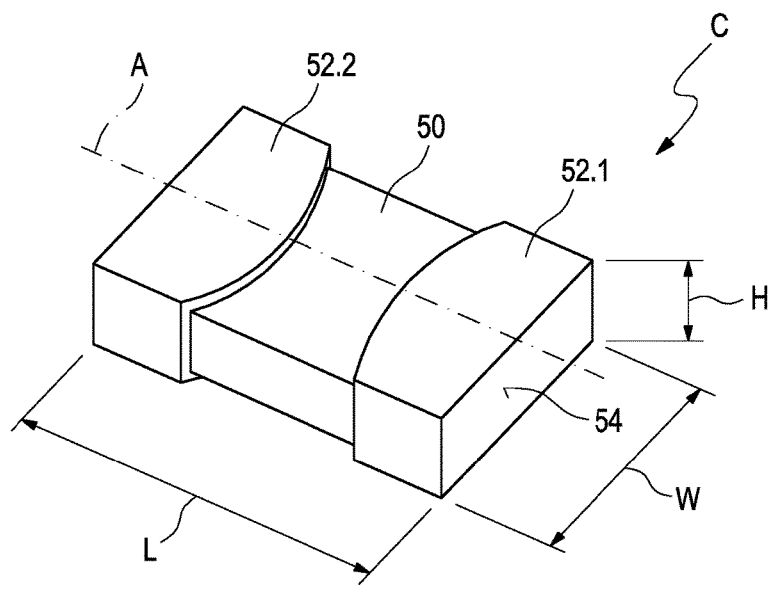
FIG. 5 shows a perspective illustration of a ceramic intermediate circuit capacitor.

Each of the intermediate circuit capacitors C1, C2, C3, C4 has a central capacitor body 50 (for example made of ceramic) and first and second connection areas 52.1 and 52.2 arranged on opposite sides of the capacitor body 50 (cf. also FIG. 5). The capacitor C has a longitudinal extent L and a width W and also a thickness H.

According to the invention, the intermediate circuit capacitors C1, C2, C3, C4 in the illustrated exemplary embodiment are introduced into the layer sequence of the printed circuit board element LP in a "standing" or vertical manner. Standing or vertical in this context means that the capacitor is oriented by way of the connection areas thereof in each case facing in the direction of the two busbars lying one above the other. Or in other words: the capacitor extends with a direction A defined from one connection area to an opposite connection area substantially vertically to an areal extent of the printed circuit board element LP. A respective contact area 54 pointing toward the busbar is therefore defined by the product of the width W and the thickness H.

The intermediate circuit capacitors C or C1, C2, C3, C4 are contact-connected in a manner known per se by formation of blind holes 56, 58 between the busbars 20 and 22, respectively, and the respective contact areas 54 of the capacitors C pointing toward the busbars. The openings for the blind holes are produced, for example, by means of laser drilling, for example CO2 laser drilling, with defined stopping at the contact areas 54 in order not to damage them.

It should be emphasized at this point that the term "blind hole" is to be understood in this application as a synonym for each kind of vertical contact-connection in a conductor layer construction that connects an area on the outside and an area located below or above it to one another. The directional indication "vertical" relates here to the direction vertical to a longitudinal extent of the layer construction, as can also be seen from the illustrations.

The terminal point for the central terminal U is located in the third busbar 24. The electrical "wiring" of the illustrated electronic switching element 12 is therefore such that a connection is provided from the first busbar 20 via blind holes 60 to the first semiconductor switch 14. The first semiconductor switch 14 is connected to the third busbar 24, by means of which a connection is in turn provided to the electric motor EM (not illustrated here) via the central terminal U. The central terminal U of the third busbar 24 is then connected to the second semiconductor switch 16 lying below it by means of blind holes 64. The second semiconductor switch 16 in turn is connected to the second busbar 22 lying below it by means of blind holes 66. A semiconductor switch may be formed, for example, as a unit comprising at least one semiconductor chip and one lead frame.

The semiconductor switches 14, 16 are actuated by means of control signal terminals (not illustrated in any more detail).

Figure 3:
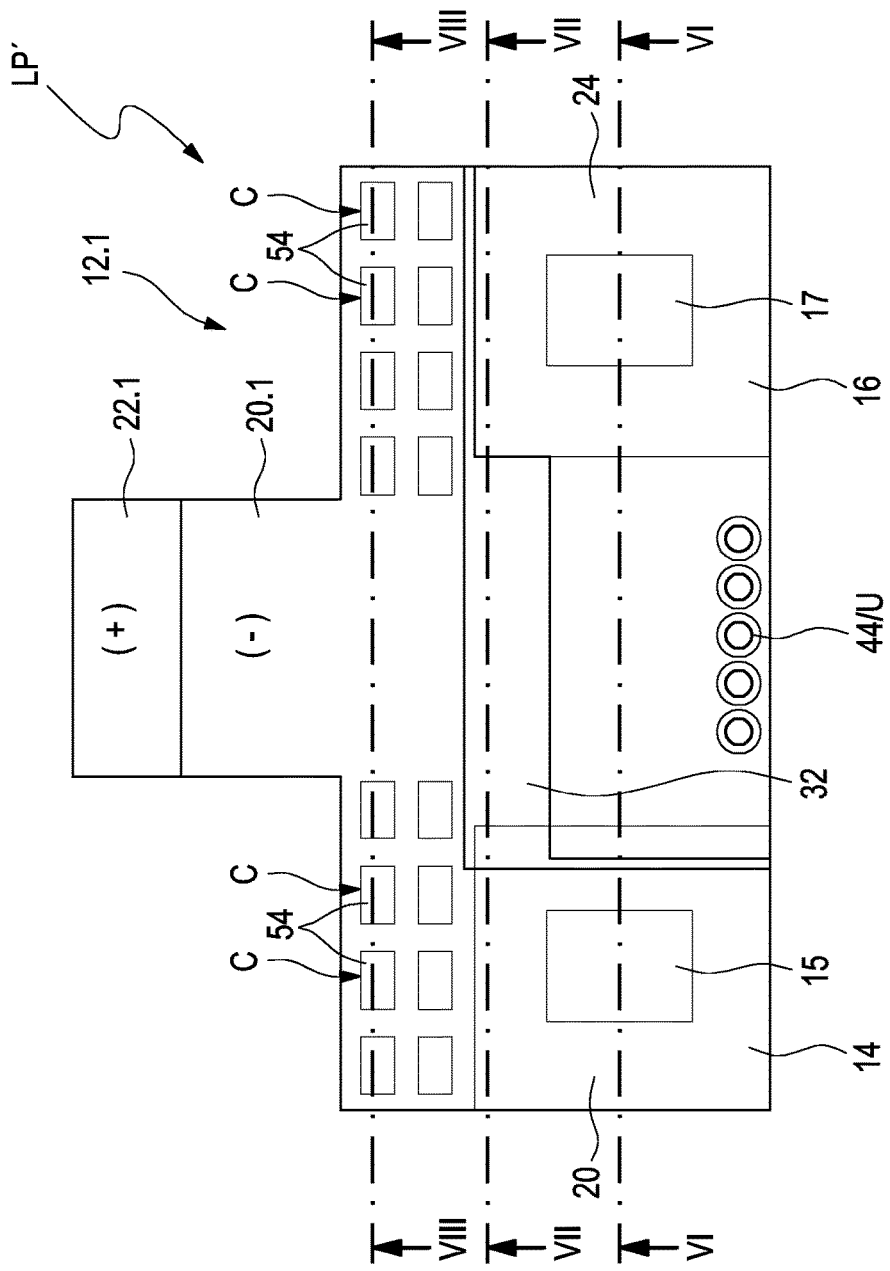
FIG. 3 shows a plan view of a highly schematic, semi-transparent illustration of an electronic switching element according to the invention.

FIG. 3 shows a (semi-transparent) plan view of an embodiment variant of the printed circuit board element LP' according to the invention. Identical elements are provided with identical reference signs.

Figure 6:
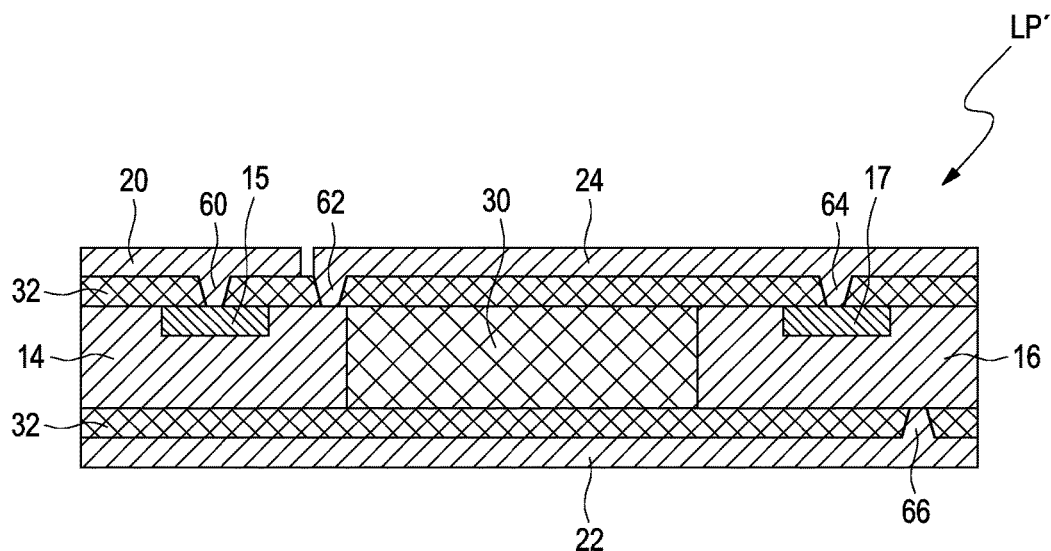
FIG. 6 shows a sectional illustration according to the sectional line VI-VI of FIG. 3.
Figure 7:
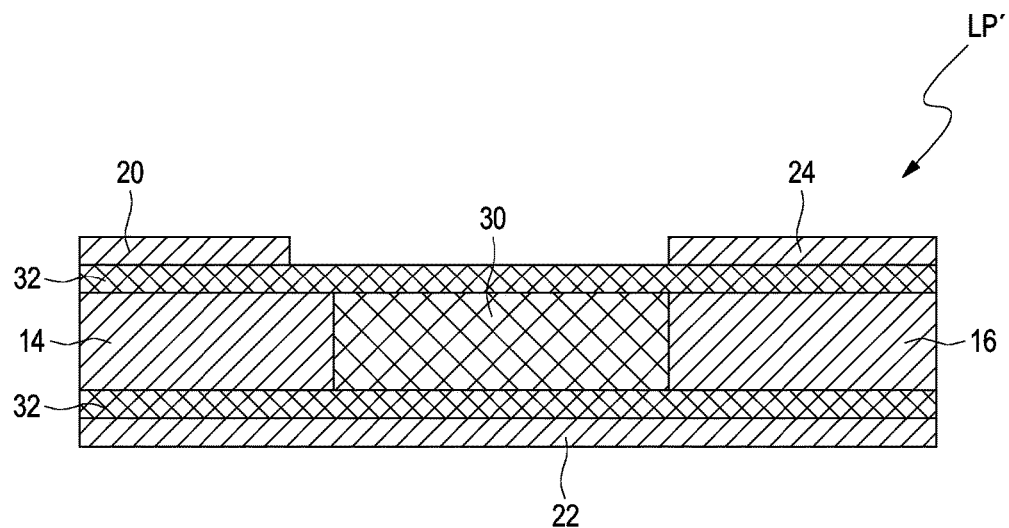
FIG. 7 shows a sectional illustration according to the sectional line VIII-VIII of FIG. 3.
Figure 8:
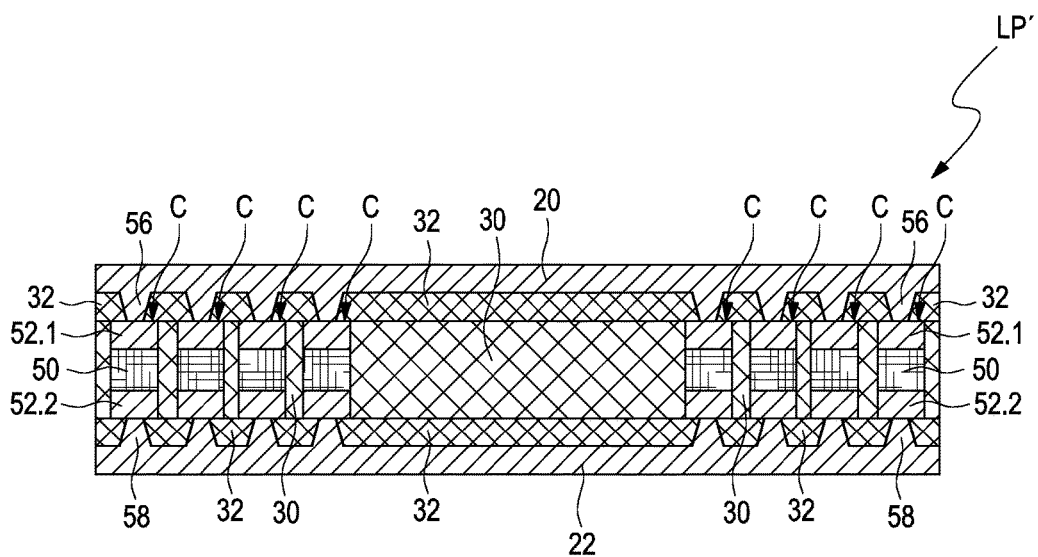
FIG. 8 shows a sectional illustration according to the sectional line VII-VII of FIG. 3.

In comparison to the illustration of FIG. 2, the exemplary embodiment of FIG. 3 has a somewhat different geometric arrangement: the multiplicity of intermediate circuit capacitors C used here are not arranged on the outside of the semiconductor switches 14, 16 (that is to say on the left and right thereof) like in the exemplary embodiment of FIG. 2, but in rows of two in two blocks in each case "behind" the semiconductor switches 14, 16 in a region in which the two busbars 20, 22 run substantially completely and continuously one above the other, as is also clear from the illustration of FIGS. 6 to 8 according to the sectional lines VI-VI, VII-VII and VIII-VIII of FIG. 3.

Contact strips 20.1, 22.1 of the two busbars 20, 22 project in a central region between the two capacitor blocks. The contact strips 20.1, 22.1 likewise run substantially one above the other. The arrangement of the capacitors C in a manner standing according to the invention leads to the contact areas 54 thereof pointing toward the observer in the plan view illustration of FIG. 3.

Figure 4:
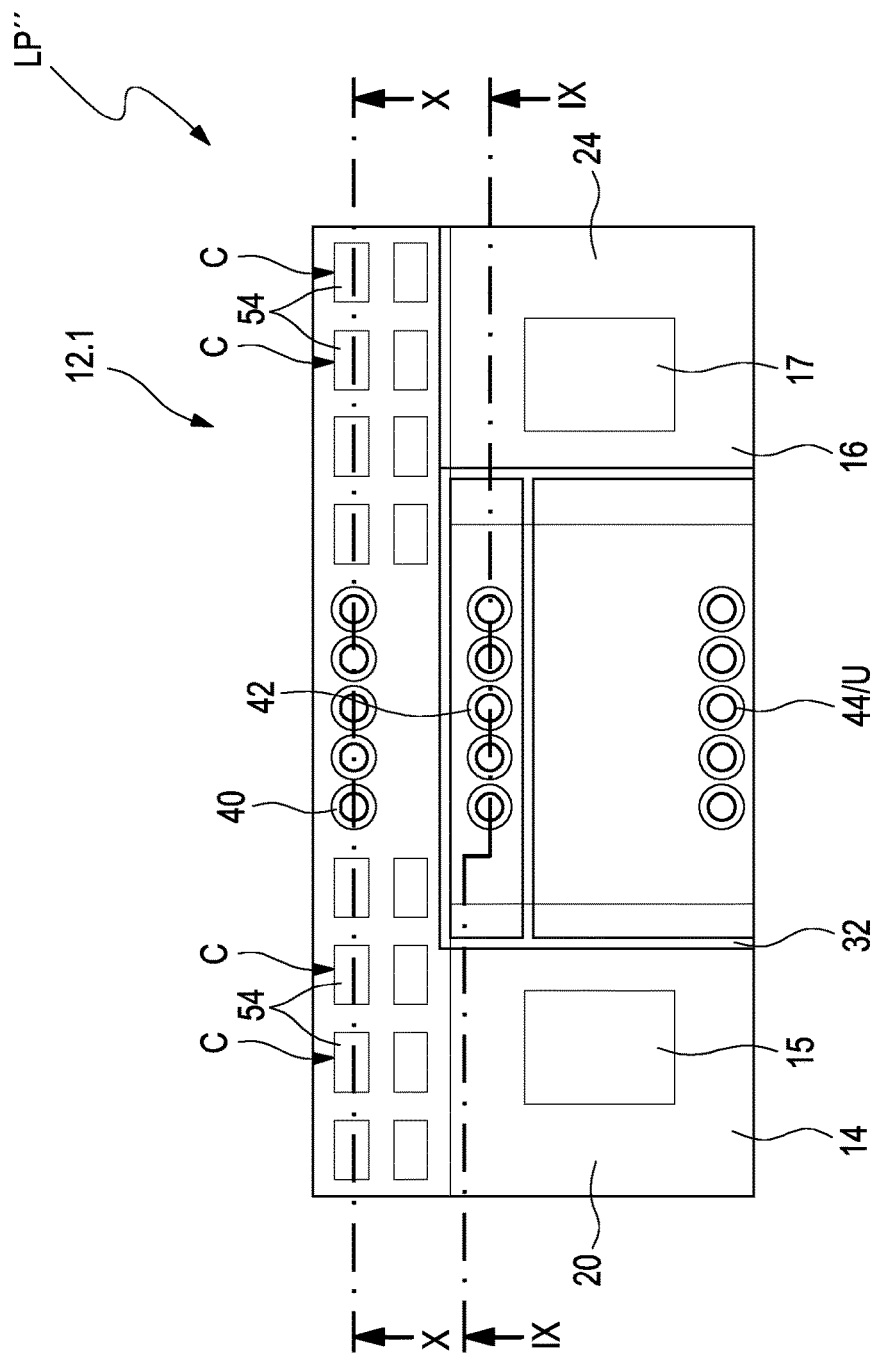
FIG. 4 shows a variant of an electronic switching element according to the invention in a highly schematic, semi-transparent plan view similar to FIG. 3.
Figure 9:
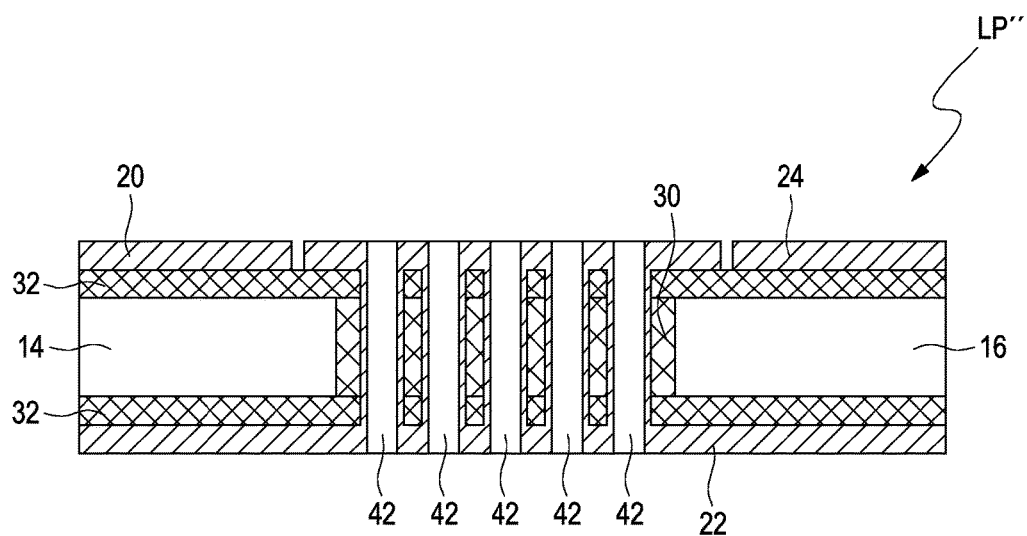
FIG. 9 shows a sectional illustration according to the sectional line IX-IX of FIG. 4.
Figure 10:
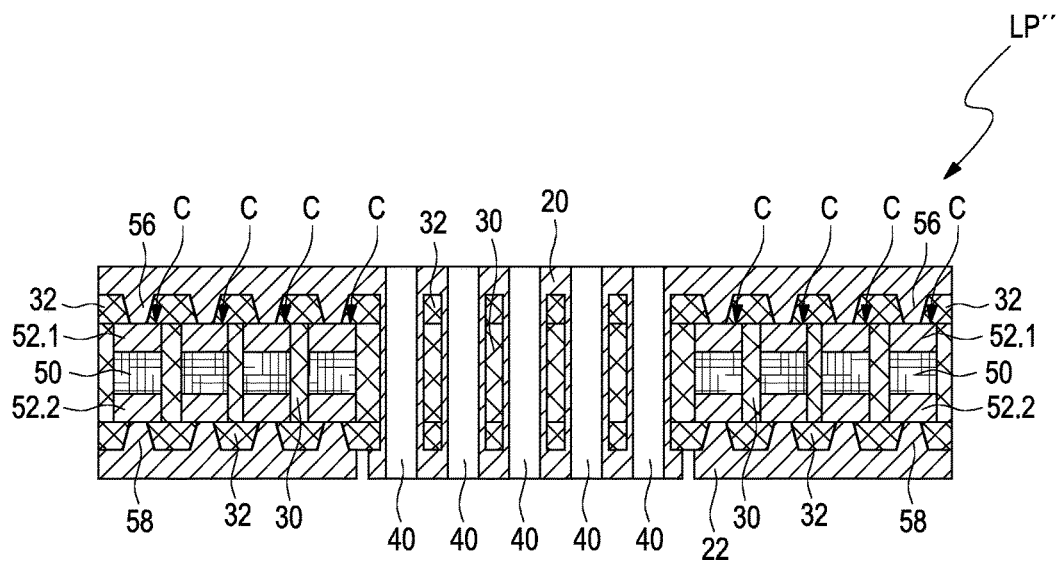
FIG. 10 shows a sectional illustration according to the sectional line X-X of FIG. 4.

As an alternative, the first and second busbars 20 and 22, respectively, can be contact-connected, instead of by means of the contact strips 20.1, 22.1 of FIG. 3, by means of vias 40 and 42, respectively, introduced into the busbars 20, 22, as is illustrated by the variant of a printed circuit board element LP" according to the invention in FIG. 4 (likewise in a (semi-transparent) plan view). As described in the following text in connection with the phase tap U, press-in plugs can be used here, wherein it should be ensured that the press-in contacts projecting through the layer sequence are exposed at the respectively other potential (cf. to this end also the sectional illustrations of FIGS. 9 and 10 according to the sectional lines IX-IX and X-X of FIG. 4).

For the sake of better or simpler contact-connection of the contact areas 54 by means of the blind holes 56, 58, it is advisable to coat the contact areas 54 before the introduction of the capacitors into the layer sequence with a surface that can be easily contact-connected, such as copper, for example. In addition, an advantage results when forming the blind holes 56, 58, 60, 62, 64, 66 when a thickness or height of the semiconductor switches 14, 16 and a length L the capacitors C1, C2, C3, C4 are adjusted to one another so that a flush termination of the semiconductor switches and the standing capacitors is achieved in the layer construction "at the bottom" and "at the top", with the result that all of the blind holes can be formed at the same depth (cf. FIG. 2).

As can be easily recognized from the illustration of FIG. 3 and the sectional illustrations of FIGS. 6 to 8, the first and the second busbar 20, 22 extend over substantially the entire width of the printed circuit board element LP. Furthermore, the two busbars also extend over the entire length thereof. As a result thereof—and due to the consequent contact-connection of all the used elements and terminals by means of blind holes and vias—the effect of the induction reduction is maximized.

The phase tap U can be contact-connected to the third busbar 24, for example, by means of vias 44. The connection can take place, for example, by means of a press-in contact or plug known to a person skilled in the art per se. Since, in this case, pressing-in takes place through all of the layers of the printed circuit board element, it must of course be ensured that the contacts are exposed at the respectively other potential.

The described printed circuit board construction of an integrated electronic switching element can be formed as a printed circuit board element having one or more switching elements, which printed circuit board element is provided for integration/embedding into a printed circuit board. As an alternative, the switching element construction can be formed as an independent printed circuit board. To form a power converter, a plurality of parallel-connected switching elements can be provided in a printed circuit board element, said switching element for example having two MOSFETs/semiconductor switches per switch and four MOSFETs per module, or a plurality of printed circuit board elements according to the invention can be connected in parallel as modules on a cooling element (which is fitted, for example, in a heat-conducting manner below the second busbar 22) or can be arranged integrated into a printed circuit board. In the case of embedding into a printed circuit board, an insulating layer or layer sequence composed of pre-preg and/or pre-preg plus inner layer material (such as FR4) can in each case plug in above and below, by way of which the printed circuit board elements are pressed. In the event of embedding a module into a further printed circuit board, the via connections 44 would take place only upon production of the outer layers of the printed circuit board with contact-connection of the area 24. As an alternative to pre-preg, glass-fiber-free dielectric materials with a sufficient thermal conductivity can also be used. As an alternative, a power converter can also be formed according to the invention by providing a plurality of switching elements according to the invention in a printed circuit board or a printed circuit board element.

The described and illustrated printed circuit board element has two semiconductor switches for illustration. A redundant circuit often has three or else more semiconductor switches. Such redundant switches can be introduced, as described, into a printed circuit board or a printed circuit board element. On account of the extremely low physical height of the switching elements according to the invention, printed circuit boards can be equipped with a multiplicity of such switches.

An electronic switching element is to be understood in connection with the present invention as meaning any kind of at least one electronic switch, such as, for example, a MOSFET, IGBT, thyristor or the like, a partial circuit arrangement generally having power semiconductors, in particular an integrated circuit. In the broadest sense, said electronic switching elements may be bridge switches, which are suitable for constructing multi-pulse bridge circuits. When using IGBTs, the use of so-called freewheeling diodes may be necessary, which is apparent to a person skilled in the art from their subject knowledge in the art.

Of course, the switching elements can also have more than two semiconductor switches for bridge circuits, as may be necessary in applications with higher currents or powers.

To produce a printed circuit board element LP according to the invention, first of all a core layer 30 is provided. In addition to recesses for the semiconductor switches 14, 16, (for example continuous) capacitor recesses for the intermediate circuit capacitors C are also provided in the core layer 30. Fitting of the capacitor recesses by inserting a respective capacitor into a recess follows. Fitting of the switch recesses provided for the semiconductor switches likewise takes place. Before or after the step of fitting, layer construction is carried out by applying pre-impregnated fiber layers 32 (so-called pre-preg layers) and copper films as starting layers for the later galvanic coating above and below the core layer.

The layer sequence thus produced is laminated. During this process, the pre-preg layers liquefy in a known manner and form a continuous dielectric layer. Before or after the step of lamination, conductive layers can be applied to form the busbars 20, 22. Then, the elements embedded in the core layer in the step of lamination are contact-connected and the conductor tracks are formed. The contact-connection takes place, for example, as illustrated above by means of blind holes. The capacitors arranged in a "standing" or vertical manner are contact-connected to the respective busbar lying below or above them by forming blind holes from the busbars to the end-side contact areas 54 of the capacitors.

In the case of a standing assembly of the capacitors, the positive and negative contacts lie above and below, respectively, that is to say for example like in the embodiments of FIGS. 2 and 3 reference sign 22 as the positive contact and reference sign 20 as the negative contact. The connected capacitors are connected to a respective (end-side) contact on the top layer 20 and the other contact on the bottom layer 22.

In the case of a horizontal assembly of the capacitors, the positive and negative contacts lie on the same side, for example either above the capacitor or below it. The contacts positive and negative/ground are electrically insulated from one another during etching of the copper layer to produce the busbars 20, 22. The capacitors are then arranged so that a contact of the capacitor is connected to positive, the other is connected to negative/ground. This is illustrated by way of example and schematically in FIG. 11.

Figure 11:
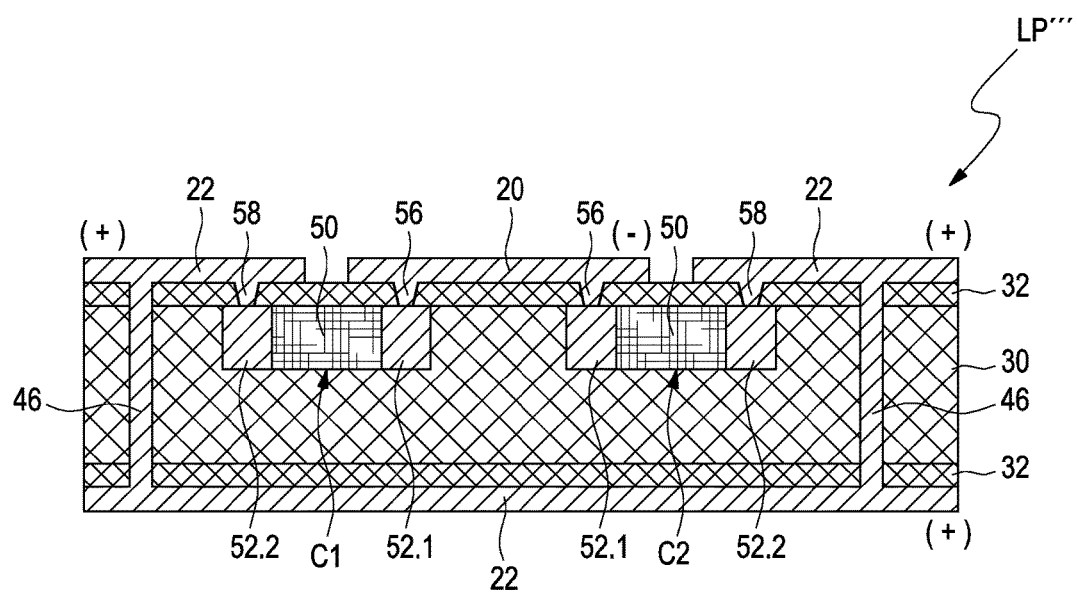
FIG. 11 shows an alternative configuration with horizontal capacitors in a sectional illustration comparable to the sectional illustration of FIG. 8.

The section shown in FIG. 11 from a printed circuit board element LP''' according to the invention shows two intermediate circuit capacitors C1 and C2 lying horizontally in the core layer 30. As already described above, each of the capacitors C1, C2 comprises a capacitor body 50 and a first and a second connection area 52.1, 52.2.

In the illustrated exemplary embodiment, the capacitors are arranged adjoining the copper layer lying above (in the drawing) (that is to say above the capacitor). Of course, an arrangement adjoining the opposite copper layer (below) is also possible. Likewise possible in principle is an alternating arrangement (top, bottom) of a plurality of capacitors. Such configuration possibilities are readily apparent to a person skilled in the art.

In the exemplary embodiment of FIG. 11, the copper layer lying at the top is structured in such a way that it forms a first busbar 20 and a second busbar 22. The second busbar 22 surrounds the first busbar 20. In the illustrated exemplary embodiment, the first busbar (as also in the exemplary embodiments above) conducts negative voltage whereas the second busbar conducts positive voltage. On account of the "horizontal" arrangement, the capacitors C1, C2 are each connected to the first and the second busbar 20, 22 by way of a longitudinal-side contact area by means of suitable blind holes 56, 58.

In order to achieve the configuration according to the invention with busbars lying substantially one above the other, the metal layer lying at the bottom is also formed as a busbar, in this case as positive busbar 22. This is achieved by means of vias 46 from the top positive busbar 22, as is illustrated in FIG. 11. Other configurations are possible and apparent to a person skilled in the art.

The illustration of FIG. 11 is similar to the sectional illustration of FIG. 8; said FIG. 11 likewise does not show any semiconductor switches since these are located outside of the selected sectional plane (that is to say in front of or behind the plane of the drawing). Accordingly, a third busbar 24 to the phase tap (U) is not illustrated either. A person skilled in the art understands that the overall arrangement likewise comprises these components.

The contacts of the semiconductors can—as is basically familiar to the person skilled in the art—also lie, for example, on a side of the printed circuit board element (instead of on opposite sides as described above in connection with the exemplary embodiments), which is associated with feeding contacts through from one side of the printed circuit board to the other (cf. also FIG. 11).

The described exemplary embodiments merely show relatively small intermediate circuit capacitors, which serve for buffering voltage peaks and which are referred to in connection with the present application as primary intermediate circuit capacitors. Usually, power converter arrangements also have higher-capacitance capacitors (DC links), which are referred to in the present application as secondary intermediate circuit capacitors and are not dealt with in more detail here.

The invention claimed is:

1. A printed circuit board element comprising:
   at least one electronic switching element integrated in the printed circuit board element;
   the at least one electronic switching element comprises two semiconductor switches formed in a layer sequence of the printed circuit board element;
   at least two busbars formed to contact the semiconductor switches, the busbars are arranged substantially one above the other in a layer sequence of the printed circuit board element; and
   at least one intermediate circuit capacitor arranged between the at least two busbars is formed in the layer sequence of the printed circuit board element.

2. The printed circuit board element of claim 1, wherein the at least two busbars are formed as conductive layers.

3. The printed circuit board element of claim 1, wherein the semiconductor switches are arranged in a core layer of the printed circuit board element and at least one busbar of the busbars for contacting the semiconductor switches is arranged in a plane of the printed circuit board element below the core layer and at least one busbar is arranged in a plane of the printed circuit board element above the core layer.

4. The printed circuit board element of claim 1, wherein the at least one electronic switching element is a half-bridge or wherein at least one of the at least one intermediate circuit capacitor is formed as an RC element or wherein at least one additional secondary capacitor is provided or wherein the at least one intermediate circuit capacitor is introduced in a substantially vertical manner or in a substantially horizontal manner.

5. The printed circuit board element of claim 3, wherein the at least one intermediate circuit capacitor is arranged in the core layer of the printed circuit board element and, with a first connection area, points in the direction of the busbar above the core layer and, with a second connection area, points in the direction of the busbar below the core layer, or wherein the at least one intermediate circuit capacitor is arranged in the core layer of the printed circuit board element and points with both a first connection area and a second connection area in the direction of the busbar above or below the core layer, respectively.

6. The printed circuit board element of claim 1, wherein the busbars are arranged substantially above or below the semiconductor switches.

7. The printed circuit board element of claim 1, wherein the busbars are connected to the two semiconductor switches by means of vias or microvias.

8. The printed circuit board element of claim 1, wherein at least one of the busbars at least partly overlaps at least one of the two semiconductor switches.

9. A printed circuit board having at least one printed circuit board element according to claim 1.

10. A power converter composed of at least two printed circuit board elements according to claim 1.

11. The power converter of claim 10, wherein the power converter is formed as a printed circuit board.

12. A method for producing a printed circuit board element, the method comprising the following steps:
    providing a core layer for forming a layer sequence for a printed circuit board element;
    forming at least two continuous switch recesses in an area of the core layer for receiving a respective semiconductor switch;
    forming at least one capacitor recess in an area of the core layer for receiving a respective capacitor;
    inserting a respective capacitor into the at least one capacitor recess;
    fitting the at least two continuous switch recesses with semiconductor switches;
    applying pre-impregnated fiber layers above and below the core layer and applying a film made of electrically conductive material onto the fiber layers;
    laminating the layer sequence thus produced;
    forming bores serving to contact the semiconductor switches and capacitors; and
    forming conductive layers on the electrically conductive films to form at least one first and one second busbar and to form contact connections of the at least one capacitor to the busbar lying below it or r above it.

13. The method of claim 12, in which the at least one capacitor is connected to the first busbar by way of a first connection area and to the second busbar by way of a second connection area.

14. The method of claim 12, wherein a capacitor is connected to end-side or to longitudinal-side contact areas of the capacitor.

15. The method of claim 12, wherein the capacitor is inserted in a substantially vertical manner or in a substantially horizontal manner.

* * * * *